(12) United States Patent
Kraft et al.

(10) Patent No.: US 6,794,222 B1
(45) Date of Patent: Sep. 21, 2004

(54) HDI MODULE WITH INTEGRAL CONDUCTIVE ELECTROMAGNETIC SHIELD

(75) Inventors: Philip P. Kraft, Warminster, PA (US); Gary H. Yan, Cherry Hill, NJ (US); Richard J. Teti, Drexel Hill, PA (US); Robert E. Kuffel, Mount Laurel, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 10/252,857

(22) Filed: Sep. 23, 2002

(51) Int. Cl.[7] .......................... H01L 21/44; H01L 21/48
(52) U.S. Cl. ...................... 438/109; 438/107; 438/126
(58) Field of Search ............................. 438/106, 109, 438/125, 126

(56) References Cited

U.S. PATENT DOCUMENTS

| | | | |
|---|---|---|---|
| 3,942,245 A | * 3/1976 | Jackson et al. ............... 29/591 |
| 4,783,695 A | 11/1988 | Eichelberger et al. ........ 357/65 |
| 5,324,687 A | * 6/1994 | Wojnarowski ............... 437/225 |
| 5,373,627 A | * 12/1994 | Grebe .......................... 29/841 |
| 6,255,137 B1 | 7/2001 | Gorczyca et al. ........... 438/112 |
| 6,284,564 B1 | 9/2001 | Balch et al. ................. 438/106 |
| 6,294,741 B1 | 9/2001 | Cole, Jr. et al. ............. 174/260 |
| 6,602,739 B1 | * 8/2003 | Rose et al. .................. 438/126 |

* cited by examiner

Primary Examiner—Amir Zarabian
Assistant Examiner—Pamela E Perkins
(74) Attorney, Agent, or Firm—Duane Morris LLP

(57) ABSTRACT

A method for making high density interconnected modules for radio-frequency, digital processing, or other circuits subject to radiated interference includes the step of applying sets of semiconductor chips to individual regions on an insulating flexible substrate. Electrically conductive, planar walls are procured, each having first and second broad surfaces and a through aperture. The through aperture is dimensioned to fit over at least some of the chips of a module. The aperture is registered with the chips to be surrounded, and the wall is placed over the chips. Liquid encapsulant is applied to fill the resulting cavity, thereby encapsulating the chips. HDI interconnections are made, and the modules are separated. The conductive walls define the module dimensions.

14 Claims, 5 Drawing Sheets

HDI MODULE WITH INTEGRAL CONDUCTIVE ELECTROMAGNETIC SHIELD

FIELD OF THE INVENTION

This invention relates to High-Density Interconnects for active chips, and more particularly to ameliorating the effects of radio-frequency (RF) radiation by incorporation of a molded, electrically conductive shield which is also used as a boundary for application of liquid encapsulant.

BACKGROUND OF THE INVENTION

High density interconnect assemblages such as those described in U.S. Pat. No. 4,783,695, issued Nov. 8, 1988 in the name of Eichelberger et al., and in numerous other patents, are finding increased usage. In one form of HDI assemblage, a dielectric substrate such as alumina has a planar surface and one or more wells or depressions. Each well or depression extends below the planar surface by the dimension of a component which is to become part of the HDI assemblage. The component is typically an integrated circuit, having its electrical connections or contacts on an upper surface. Each component is mounted in a well dimensioned to accommodate the component with its contacts in substantially the same plane as the planar surface of the substrate. The components are typically held in place in their wells or depressions by an epoxy adhesive. A layer of dielectric material such as Kapton polyimide film, manufactured by DuPont of Wilmington, Del., is laminated to the devices using ULTEM polyetherimide thermoplastic adhesive, manufactured by General Electric Plastic, Pittsfield, Mass., which is then heat-cured at about 260° to 300° C. in order to set the adhesive. The polyetherimide adhesive is advantageous in that it bonds effectively to a number of metallurgies, and can be applied in a layer as thin as 12 micrometers ($\mu$m) without formation of voids. Further, it is a thermoplastic material, so that later removal of the polyimide film from the components is possible for purposes of repair by heating the structure to the glass transition temperature of the polyetherimide while putting tension on the polyimide film.

Another known method for making HDI modules includes applying the chips, electrode-side-down, onto an adhesive-faced dielectric layer. The chips are then encapsulated in a rigid material, which in one embodiment is Plaskon, an epoxy material, to form a rigid molded-chip-plus-dielectric-sheet piece. The electrical interconnections are made by means of laser-drilled vias through the dielectric sheet, followed by patterned deposition of electrically conductive metallization.

SUMMARY OF THE INVENTION

A method according to an aspect of the invention is for making a multi-chip module including an electrically conductive enclosure. The method comprises the steps of procuring a planar flexible insulating substrate defining a front and rear surfaces, and selecting at least one solid-state or active chip defining a plurality of electrical connections lying in a plane. The at least one solid-state chip is disposed at a selected location on the front surface of the insulating substrate, with the plane of the electrical connections facing the insulating substrate. A generally planar electrically conductive enclosure is procured. This enclosure defines first and second broad surfaces and at least one aperture extending from the first broad surface to the second broad surface. The enclosure so procured may be made by a molding process, and in a preferred embodiment is made from molded graphite or carbonaceous material. The first broad surface of the enclosure is applied to the front surface of the insulating substrate with the aperture surrounding the location. Hardenable liquid encapsulant is applied to the front surface of the insulating substrate through the aperture in the enclosure, to a depth sufficient to encapsulate at least a portion of the at least one solid-state chip. Electrical interconnections are made to at least some of the electrical connections of the at least one solid-state chip from the second surface of the insulating substrate.

In a particular mode of the method according to an aspect of the invention, the flexible insulating substrate may be rendered planar by tensioning. In another mode, the step of applying the first broad surface of the enclosure to the front surface of the insulating substrate with the aperture surrounding the location may precede the step of disposing the at least one solid-state chip at a selected location on the front surface of the insulating substrate. The step of making interconnections may include the steps of forming apertures through the insulating substrate to at least some of the electrical connections to thereby expose at least portions of the electrical connections, and metallizing of the apertures and the exposed portions of the electrical connections.

For some purposes, a variant of a mode of a method according to an aspect of the invention relating to applying the enclosure may include the step of laminating the enclosure to the front surface of the insulating substrate. In one manifestation, the step of applying the enclosure includes the steps of (1) applying adhesive to at least a portion of one of (a) the first broad surface of the enclosure and (b) the first broad surface of the insulating substrate, and (2) applying the first broad surface of the enclosure to the first surface of the insulating substrate, with at least a portion of the adhesive lying therebetween.

The enclosure may define a plurality of apertures extending from the first to the second broad surfaces. Similarly, the enclosure may bear a surface metallization over some or all of its surface. A further step may include the making of electrical connections through the insulating substrate to the enclosure.

DESCRIPTION OF THE INVENTION

Figure 1A:
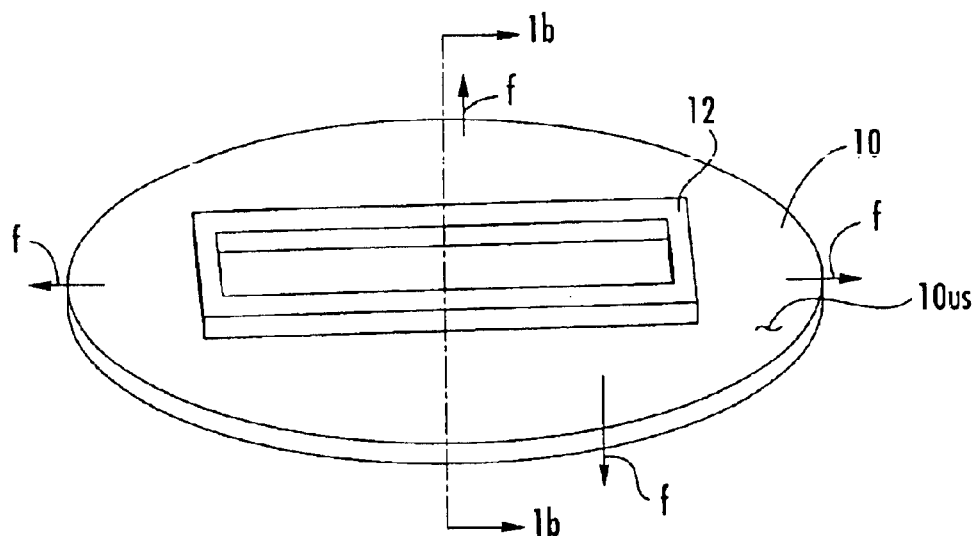
FIG. 1a is a simplified perspective or isometric view of a tensioned dielectric sheet onto which conductive slug enclosure material has been affixed.
Figure 1B:
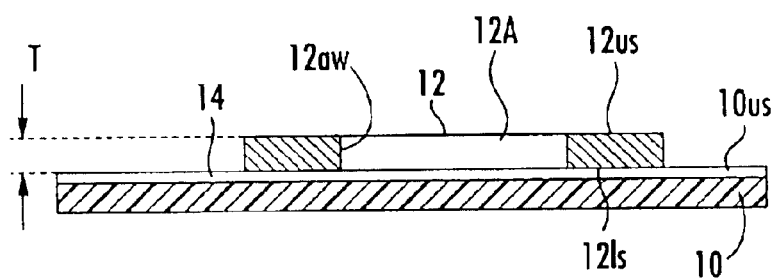
FIG. 1b is a cross-section of the structure of FIG. 1a looking in the direction 1b—1b, according to the method described in a copending application.

A technique for making multi-chip modules is described in a copending application Ser. No. 10/100,658, filed Mar. 18, 2002, in the name of Kapusta et al., assigned to the same assignee as the present invention. In FIGS. 1a and 1b, a tensioned dielectric sheet 10 defines an upper surface 10us. The tensioning may be applied by way of a frame, as known in the art, to produce a radial outward force indicated by arrows f. The upper surface 10us may be coated with adhesive. A layer of electrically conductive "wall" material 12 is affixed to the upper surface 10us of dielectric sheet 10, as for example by application of a layer 14 of adhesive to the upper surface 10us. Conductive layer 12 may have any thickness T, but in one embodiment of the arrangement of the abovementioned Kapusta patent application, has a thickness of 0.040 inch. Such a thickness of material may possibly be better fabricated by stamping rather than by deposition, but any method will do, including machining from a block of conductive metal. As illustrated, the conductive pattern is in the form of an open rectangle or surrounding wall defining an aperture 12A. Such a pattern can be useful in the context of electrically shielding or wall components lying within the enclosed portion. Such a shape may also be useful for grounding electrical circuits, especially if the electrically conductive piece 12 is itself connected to an external ground.

Figure 2:
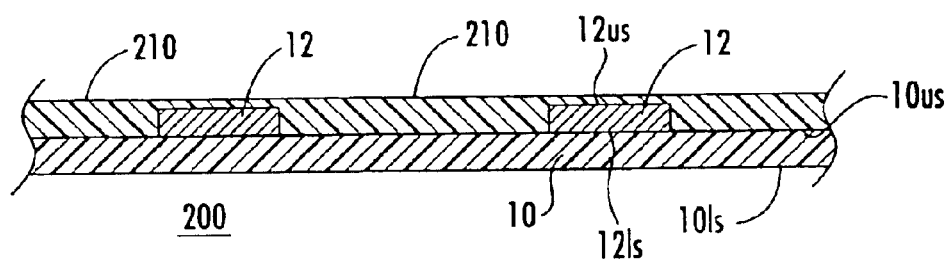
FIG. 2 is a simplified cross-section of the structure of FIGS. 1a and 1b after encapsulation.

In FIG. 2, the structure of FIG. 1b has been covered with a layer of encapsulating or fill material 210. In one embodiment, the encapsulating material is the abovementioned Plaskon material. Once the encapsulating material is hardened, the layer becomes rigid to thereby define a rigid substrate element 200, although the thickness of the element is such that it may be somewhat flexible overall. As illustrated in FIG. 2, the encapsulating material 210 fills the region between the exposed portions of the electrically conductive material 12. As illustrated in FIG. 2, the layer 210 of encapsulant material may be thick enough to extend over the electrically conductive portions 12.

Figure 3:
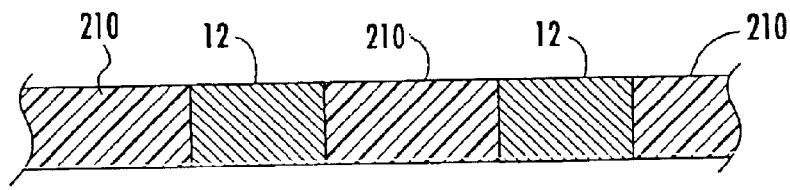
FIG. 3 is a simplified cross-section of the structure of FIG. 2 after removal of excess encapsulation and dielectric sheet.

FIG. 3 is a simplified cross-sectional view of the structure of FIG. 2 after the step of grinding or lapping both upper and lower surfaces of the structure to thereby expose the electrically conductive portions 12 at both surfaces.

Figure 4A:
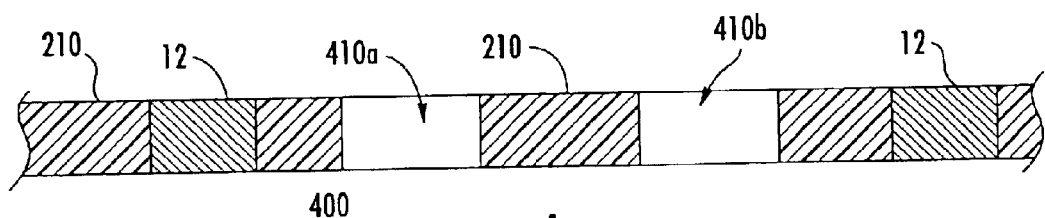
FIG. 4a is a simplified cross-sectional view, and FIG. 4b a simplified perspective or isometric view, of the structure of FIG. 3 after the defining of apertures for placement of chips.
Figure 4B:
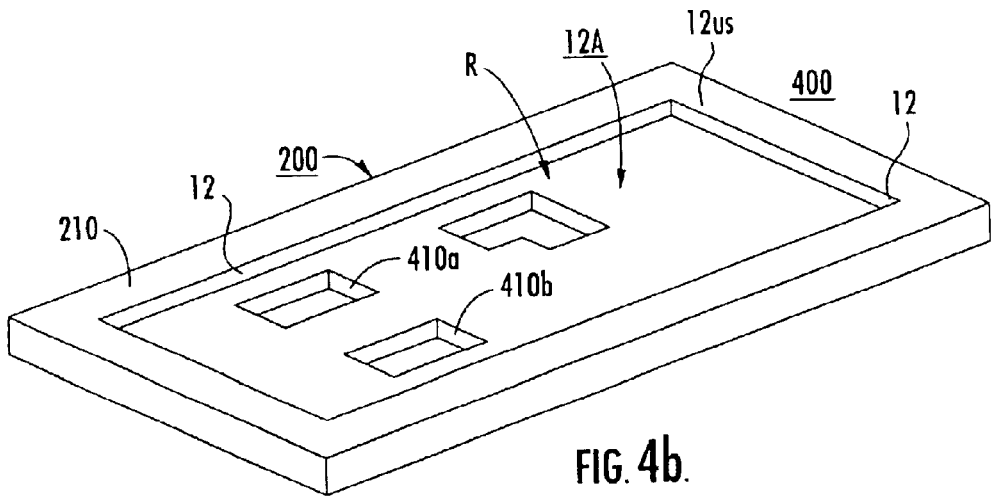

FIGS. 4a and 4b illustrate the result of forming apertures 410a and 410b within the region R which is electrically shielded by the presence of electrically conductive slug 12. The apertures are dimensioned to accommodate the various semiconductor or solid-state chips (chips) which are intended for mounting therein.

Figure 5:
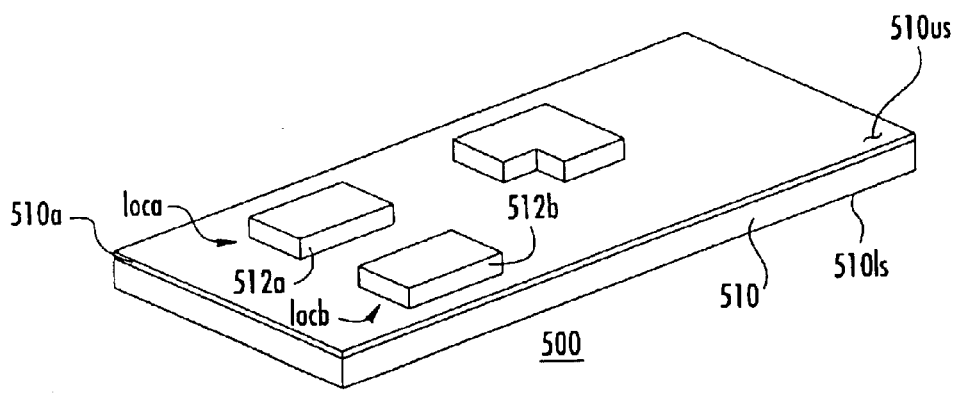
FIG. 5 is a simplified perspective or isometric view of another dielectric sheet with semiconductor or solid-state chips mounted thereon in a pattern registered with the apertures of the structure of FIGS. 4a and 4b.

FIG. 5 illustrates a structure 500 including a sheet 510 of dielectric material on which a plurality of semiconductor or solid-state chips, two of which are designated 512a and 512b, are mounted. The mounting may be accomplished by applying adhesive to either the electrical connection sides of the chips or to the dielectric sheet 510, and bringing the chips into contact with the dielectric sheet 510. The locations of the chips are selected to be registered with each other and with the apertures 410a and 410b in structure 400 of FIGS. 4a and 4b. Thus, the locations (loc a and loc b) of the chips 512a, 512b on upper surface 12us of dielectric 512 of FIG. 4b correspond with the locations of apertures 410a, 410b of the structure of FIG. 4a.

Figure 6:
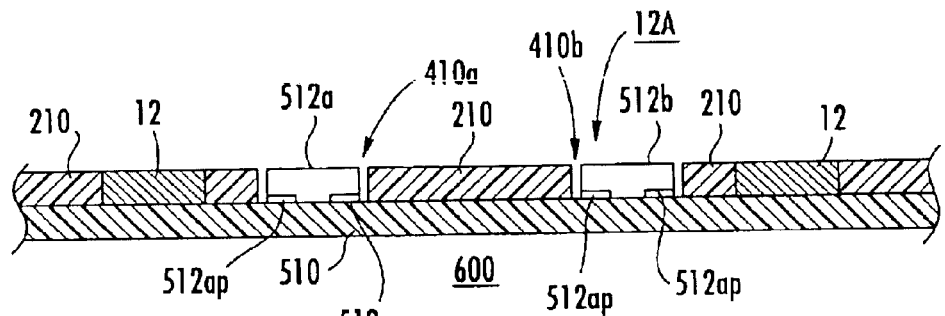
FIG. 6 is a simplified cross-sectional view of the structure of FIGS. 4a and 4b juxtaposed with that of FIG. 5.

FIG. 6 is a cross-sectional view of the combined structures 400 of FIG. 4 with 500 of FIG. 5. In FIG. 6, the semiconductor or solid-state chip 512a lies within aperture 410a, and chip 512b lies within aperture 410b. The resulting structure is designated 600.

Figure 7:
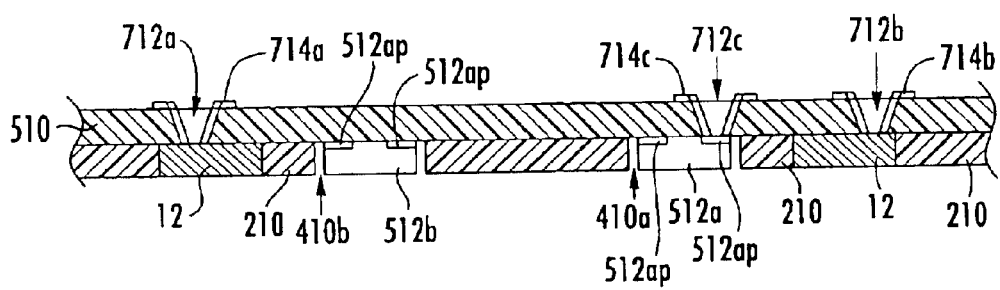
FIG. 7 is a simplified cross-sectional view of the structure of FIG. 6, with the addition of through vias and circuit metallizations or depositions.

FIG. 7 illustrates the structure 600 of FIG. 6, turned over for convenience in understanding, with layer 510 of dielectric material lying above the remaining structure. As illustrated in FIG. 7, through vias 712a, 712b, and 712c are made in the conventional manner through dielectric material 510 at the locations of the conductive slugs 12 and at the location of a contact pad 512ap of semiconductor or solid-state chip 512a. Metallizations 714a and 714b overlie the locations of electrically conductive slugs 12, while metallization 714c overlies one of the electrical contacts or pads of semiconductor or solid-state chip 512a.

Figure 8:
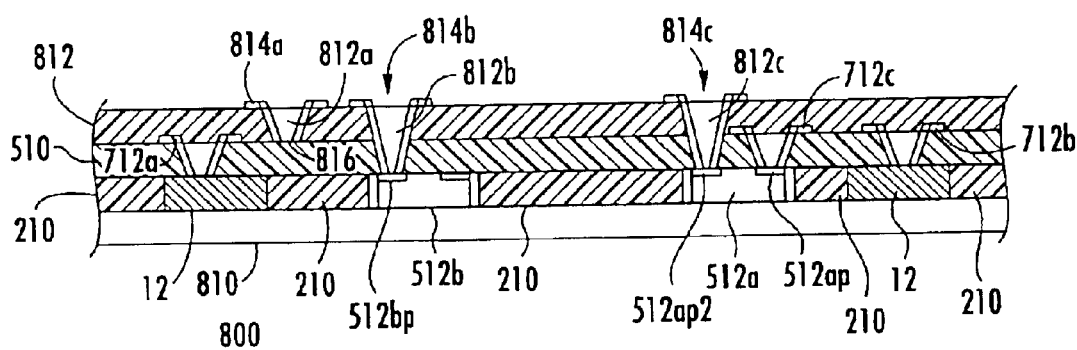
FIG. 8 is a simplified cross-sectional view of a completed multi-chip module according to one technique of the copending application, including a ground/thermal coupling plate.

FIG. 8 is a cross-sectional view of a module structure 800 built up from structure 700 of FIG. 7. Structure 800 includes a further heat-sink layer 810 affixed to the bottom of structure 700, and thermally coupled at least to the lower surfaces of semiconductor or solid-state chips 512a and 512b, for aiding in carrying away heat therefrom. Alternatively, or in addition, the heat sink layer 810 can be electrically conductive, and be in galvanic contact with the electrically conductive slugs 12. In addition, a further dielectric interconnect layer 812 is affixed to the upper surface of layer 510. Interconnect layer 812 includes further through vias and metallizations, for making other connections. More particularly, dielectric interconnect layer 812 has through vias and metallizations 814a, 814b, and 814c made therethrough at locations of an intermediate-level connection pad 816, and at the locations of contact pads 512bp and 512ap2.

Other embodiments of the method described in the Kapusta patent application include the use of any planar shape, however complex, in place of the simple open rectangle of the illustrations. There is no need for the various portions of the conductor to be contiguous (that is to say, in direct or galvanic electrical contact). The pattern may also be exposed, in some or all areas, to the edge of the molded substrate. In addition to the pattern, other components, such as resistors, capacitors, or other passive or active components which can be completely encapsulated without detrimental effect, may be added to the original dielectric sheet and encapsulated into the structure together with the metal pattern. Such items or components might be thinner that the final substrate thickness so as not to interfere with grinding, if used. It would probably be easier to have the passive parts added during the substrate structure formation, thus eliminating the need to open up apertures for them later; on the other hand, one aperture could accommodate more than one component . . . that is, the structure formed may have only one aperture which fits over a plurality, or all the active and passive components applied to the second dielectric sheet. Open space left in the aperture is optionally filled with a suitable material after placement of the structure over the components. Removal of the dielectric sheet used to form the substrate or removal of excess molding material, if present, is optional. A metal interconnect may be optionally placed onto the substrate to form an interconnect structure between the metal pattern and added components and provide pads for further interconnect integration with the second dielectric sheet onto which it is placed. After placement of the structure over the semiconductor chips and components on flex, the remaining open space within the apertures formed to accommodate the components may be optionally filled with a suitable material.

According to an aspect of the invention, the conductive "wall" material is used as a form or dam which defines the boundaries of the encapsulant region, and additionally serves the purpose of reduction of electromagnetic coupling to and from those active devices located within the wall. According to another aspect of the invention, the conductive wall material is made from a molded conductive material such as graphite.

Figure 9:
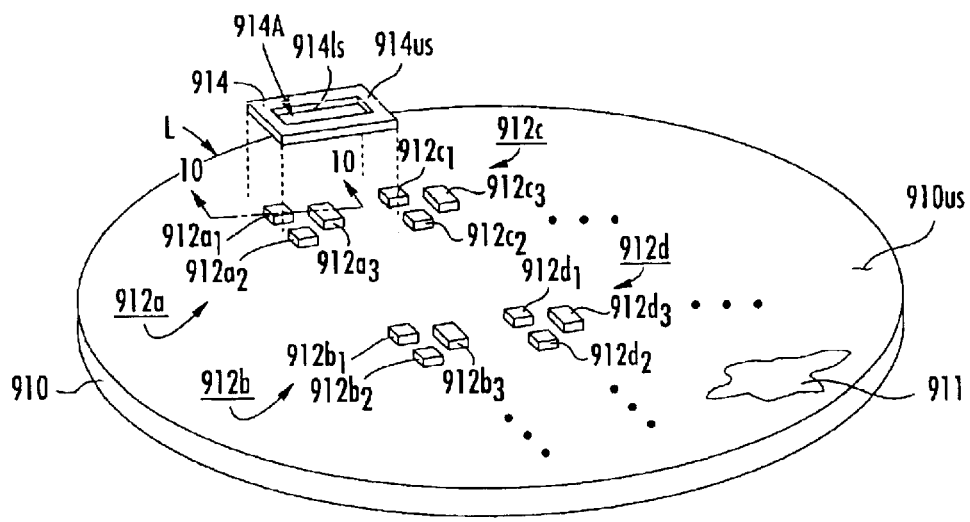
FIG. 9 is a simplified perspective or isometric view, similar to that of FIG. 1, showing the locations of multiple modules on an insulating flexible sheet, plural chips at each location, and one electrically conductive molded wall spaced away from one of the modules.

FIG. 9 is a simplified perspective or isometric view which illustrates a tensioned sheet 910 of insulating material, similar to sheet 10 of FIG. 1. Upper surface 910us of sheet 910 is coated with a layer of adhesive, a portion of which is illustrated as 911. In FIG. 9, sheet 910 has a plurality of sets of active semiconductor or solid-state chips held in place thereon by adhesive 911. More particularly, the illustrated sets are each of three chips. A first set 912a of chips includes chips 912$a_1$, 912$a_2$, and 912$a_3$, a second set 912b of chips includes chips 912$b_1$, 912$b_2$, and 912$b_3$, a third set 912c of chips includes chips 912$c_1$, 912$c_2$, and 912$c_3$, and a fourth set 912d of chips includes chips 912$d_1$, 912$d_2$, and 912$d_3$. In FIG. 9, set 910a of chips is illustrated as being at a location designated L, and also shows their electrical connections 912$_{conn}$ as being adjacent the upper surface 910us of the sheet 910 of insulating material.

FIG. 9 also illustrates, separated from the surfaces 910us or 911 of the insulating sheet and adhesive, respectively, a single molded, electrically conductive wall or surround, which may be used for the same purposes as wall 12 of FIG. 1. Molded, electrically conductive wall 914 defines a broad upper surface 914us and a similar broad lower surface 914ls, only the edge of which is visible. As illustrated, an aperture 914A extends through the structure of wall 914 from upper surface 914us to lower surface 914ls. Ideally, molded electrically conductive wall 914 is metallized to enhance its conductive nature. Molded wall 914 is illustrated in FIG. 9 as being located above location L occupied by set 912a of chips.

Figure 10:
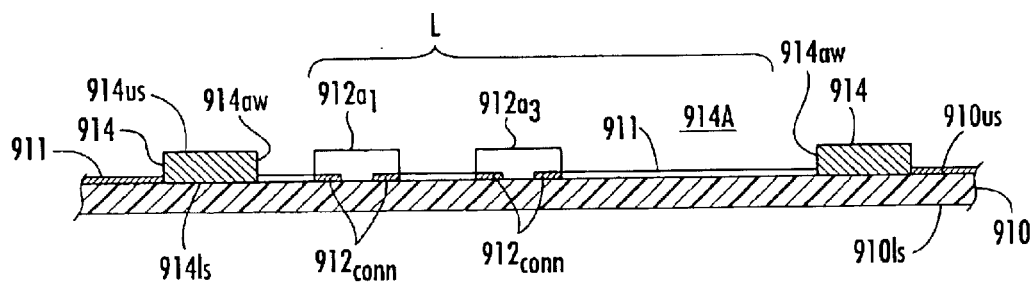
FIG. 10 is a simplified cross-section of the structure of FIG. 9 at a module location, illustrating the aperture of the electrically conductive molded wall co-located with the region in which the chips of the module location according to an aspect of the invention, so that the walls encompass the chips to define a cavity.

FIG. 10 is a simplified cross-sectional illustration of a portion of the structure of FIG. 9 in region L, looking in direction 10—10, with molded electrically conductive wall 914 mounted with its aperture 914A over region L and held in place by adhesive layer 911, so that wall 914 surrounds region L.

It has been found that direct attachment of the wall to the flexible substrate 910 (flex) led to some surface roughness and camber. Improved results were achieved by a process which placed the chips or die on the flex together with locating posts, followed by a curing in a pressure bake. The molded conductive wall was then coated with die attach adhesive, and manually placed onto the flex frame, registering apertures in the walls to the locating posts for proper placement. The entire assembly was then placed in a lamination press, with an inflated bladder pressing the wall and the underlying flex against a flat surface. This force tends to flatten any camber in the wall, which helps in minimizing void formation during the subsequent fill with liquid encapsulant. The lamination process temperatures are selected to minimize outgassing during the lamination, as known to those skilled in the art. Outgassing may lead to void formation.

Some surface roughness has been observed in the metallized or plated wall structure 914. The presence of this wall roughness can lead to formation of voids during the encapsulation step, because a broad surface of the wall, such as surface 914ls, does not contact the flexible sheet 910 uniformly. Various ways were tried to reduce the possibility of void formation due to the presence of this roughness. One method was to lap one broad surface or side (as for example broad surface 914us) of the plated structure, followed by a separate metallization with four microns of gold sandwiched between two layers, each of 1000 angstroms of TiW, also designated 1KÅTiW/4 μAu/1KÅTiW. Another way to achieve a smooth plated or metallized surface is to apply 1KÅTiW/4 μAu/1KÅTiW to the as-received surface or to a lapped surface of the wall structure.

Figure 11:
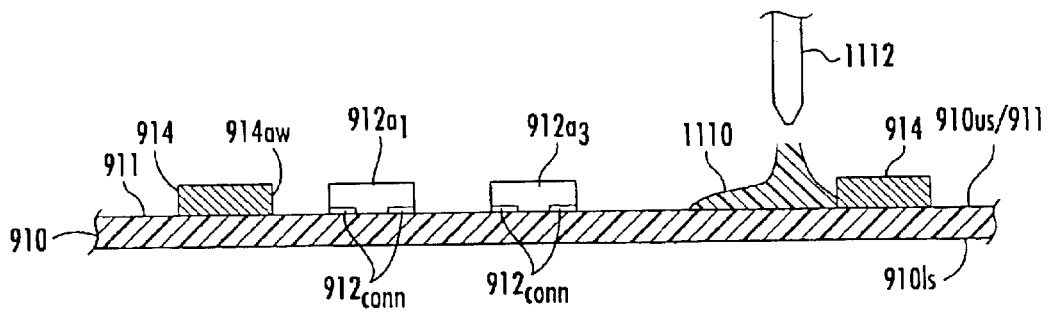
FIG. 11 is a simplified cross-section similar to that of FIG. 10, showing the step of filling the cavity of the enclosure with liquid or granular encapsulant.
Figure 12:
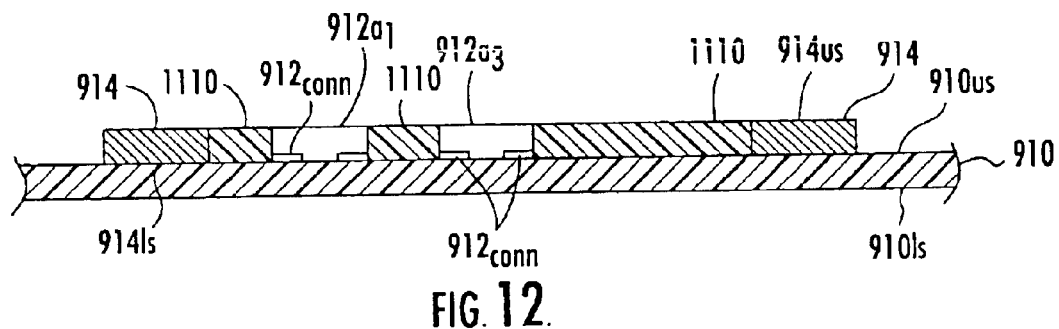
FIG. 12 is a simplified cross-section similar to that of FIG. 11, showing the result of continuing the filling of the cavity with encapsulant until only the back sides of the chips are left exposed.

FIG. 11 illustrates the application or dispensing of liquid encapsulant 1110 from a nozzle 1112 into the region L, which is surrounded by molded electrically conductive wall 914. The dispensing takes place until at least some of the chips are encapsulated. More particularly, the liquid encapsulant will seek its own level before hardening or being hardened. The level may be such as to encapsulate some of the chips, and only partially encapsulate other chips which may be higher (as measured from surface 914us) than other chips. FIG. 12 illustrates the result of filling the cavity defined by the combination of wall 914 and flex 910. As illustrated, the encapsulant fills the cavity to the height of the chips. If the walls were higher or the chips lower in height, the encapsulant would flow over the backsides of the chips, and if the chips were higher, or the fill height less than that illustrated, more of the backsides of the chips would be exposed.

Following the steps illustrated in relation to FIGS. 9 through 12, HDI connections may be made to the electrical connections (912$_{conn}$) of the chips of FIG. 12 in the usual manner, by formation of through vias from lower broad side 910ls of the insulating sheet 910 to the applicable ones of the connections 912$_{conn}$ on the chips of each module, generally as described in conjunction with FIGS. 7 and 8. Following the application of the HDI circuitry and connections, the various modules defined by the various sets 912 of chips of FIG. 9, together with their individual molded electrically conductive walls or surrounds and encapsulant, are separated from each other. In this method, the exterior dimensions of each wall 914 define the exterior dimension of the resulting module.

Figure 13:
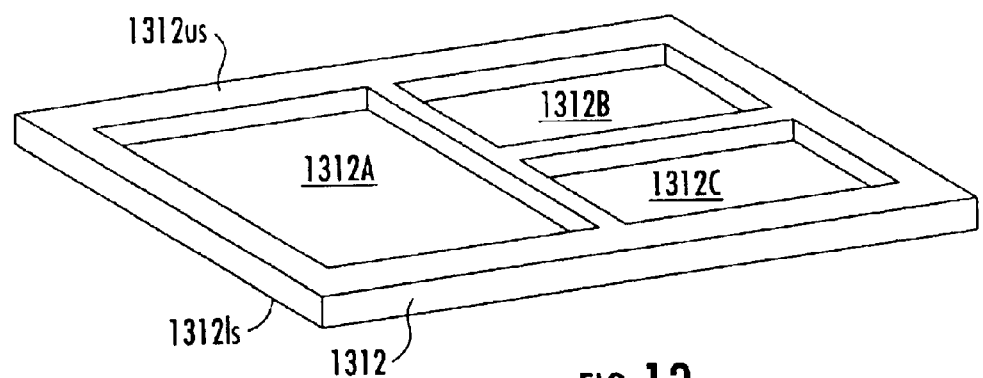
FIG. 13 is a simplified perspective or isometric view of a conductive slug corresponding to that of FIG. 1, but differing therefrom in that it defines a plurality of through apertures.
Figure 14:
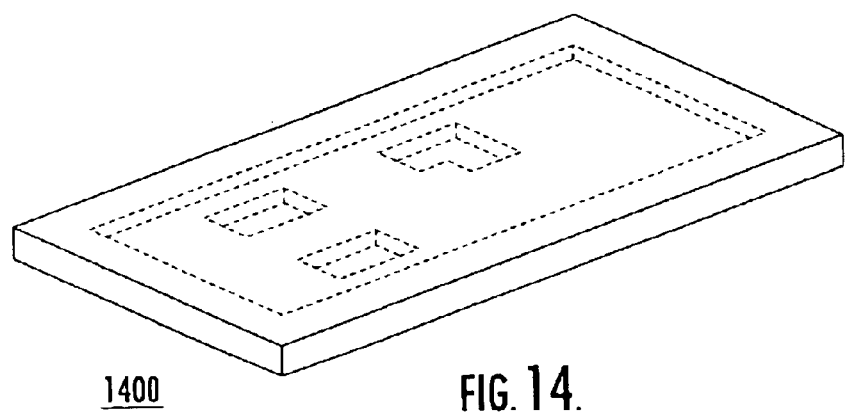
FIG. 14 represents a completed module.

FIG. 13 illustrates an alternative form of electrically conductive slug or isolation wall 1312 which can be used according to an aspect of the invention. As illustrated in FIG. 13, conductive wall 1312 includes a plurality of apertures 1312A, 1312B, and 1312C, which when assembled into a module define mutually electrically or electromagnetically isolated component mounting areas. FIG. 14 represents a single multi-chip module (1400) made by a method according to an aspect of the invention, in which the encapsulation conceals details. Such a module, while represented as being rectangular in shape, may of course have any morphology.

Thus, a method according to an aspect of the invention is for making a multi-chip module (1400) including an electrically conductive enclosure (12, 914, 1312). The method comprises the steps of procuring a planar flexible insulating substrate (10, 510, 910) defining a front (10us, 510us, 910us) and rear (10ls, 510ls, 910ls) surfaces, and selecting at least one solid-state or active chip (12, 512, 912) defining a plurality of electrical connections (512ap, 512bp, 912$_{conn}$) lying in a plane. The at least one solid-state chip (12, 512, 912) is disposed at a selected location on the front (10us, 510us, 910us) surface of the insulating substrate (10, 510, 910), with the plane of the electrical connections (512ap, 512bp, 912$_{conn}$) facing the insulating substrate (10, 510, 910). A generally planar electrically conductive enclosure (12, 914, 1312) is procured. This enclosure (12, 914, 1312) defines first (12ls) and second (12us) broad surfaces and at least one aperture (12A, 914A, 1312A, 1312B, 1312C) extending from the first broad (12ls, 914ls) surface to the second (12us, 914us) broad surface. The enclosure (12, 914, 1312) so procured may be fabricated by a molding process, and is preferably of a carbonaceous material. The first broad surface (12ls, 914ls) of the enclosure (12, 914, 1312) is applied to the front (10us, 510us, 910us) surface of the insulating substrate (10, 510, 910) with the aperture (12A, 914A) surrounding the location (loc a, loc b). Hardenable liquid encapsulant (1110) is applied to the front (10us, 510us, 910us) surface of the insulating substrate (10, 510, 910) through the aperture (12A, 914A) in the enclosure (12, 914, 1312), to a depth sufficient to encapsulate at least a portion of the at least one solid-state chip (12, 512, 912). Electrical interconnections (712a, 712b, 712c) are made to at least some of the electrical connections (512ap, 512bp, 912$_{conn}$) of the at least one solid-state chip (12, 512, 912) from the second (10ls, 510ls, 910ls) surface of the insulating substrate (10, 510, 910).

In a particular mode of the method according to an aspect of the invention, the flexible insulating substrate (10, 510, 910) may be rendered planar by tensioning. In another mode, the step of applying the first broad surface (12ls, 914ls, 1312ls) of the enclosure (12, 914, 1312) to the front (10us, 510us, 910us) surface of the insulating substrate (10, 510, 910) with the aperture (12A, 914A) surrounding the location (loc a, loc b) may precede the step of disposing the at least one solid-state chip (12, 512, 912) at a selected location on the front (10us, 510us, 910us) surface of the insulating substrate (10, 510, 910). The step of making interconnections (512ap, 512bp, 912$_{conn}$) may include the steps of forming apertures or vias through the insulating substrate (10, 510, 910) to at least some of the electrical connections (512ap, 512bp, 912$_{conn}$) to thereby expose at least portions of the electrical connections (512ap, 512bp, 912$_{conn}$), and metallizing of the apertures and the exposed portions of the electrical connections (512ap, 512bp, 912$_{conn}$).

For some purposes, a variant of a mode of a method according to an aspect of the invention relating to applying the enclosure (12, 914, 1312) may include the step of laminating the enclosure (12, 914, 1312) to the front (10us, 510us, 910us) surface of the insulating substrate (10, 510, 910). In one manifestation, the step of applying the enclosure (12, 914, 1312) includes the steps of (1) applying adhesive (510a) to at least a portion of one of (a) the first broad surface (12ls, 914ls) of the enclosure (12, 914, 1312) and (b) the first broad surface of the insulating substrate (10, 510, 910), and (2) applying the first broad surface (12ls, 914ls) of the enclosure (12, 914, 1312) to the first surface (10us, 510us, 910us) of the insulating substrate (10, 510, 910), with at least a portion of the adhesive (510a) lying therebetween. In another avatar, that aperture (12A, 914A) extending through the enclosure (12, 914, 1312) defines aperture walls (12aw, 914aw).

The enclosure (12, 914, 1312) may define a plurality of apertures (12A, 914A, 1312A, 1312B, 1312C) extending from the first (12ls, 914ls, 1312ls) to the second (12us, 914us, 1312us) broad surfaces. Similarly, the enclosure (12, 914, 1312) may bear a surface metallization over some or all of its surface, as for example to enhance conductivity. A further step may include the making of electrical connections (712a, 712b) through the insulating substrate (10, 510, 910) to the enclosure. Once the module is generated, it may be separated from other such modules which may have been made concurrently therewith on the same substrate in such a manner, as by cutting, as makes the finished module dimensions equal to the outer dimensions of the conductive enclosure.

What is claimed is:

1. A method for making a multi-chip module including an electrically conductive enclosure, said method comprising the steps of:

procuring a planar flexible insulating substrate defining a front surface and a rear surface;

selecting a plurality of sets of solid-state chips, each chip defining a plurality of electrical connections lying in a plane;

disposing said plurality of sets of solid-state chips on said front surface of said insulating substrate in a pattern which is the same from set to set, with said plane of said electrical connections facing said insulating substrate;

procuring at least one generally planar electrically conductive enclosure defining first and second broad surfaces and at least one aperture extending from said first broad surface to said second broad surface;

applying said first broad surface of said enclosure to said front surface of said insulating substrate with said aperture surrounding only one set of said chips;

applying hardenable liquid encapsulant to said front surface of said insulating substrate through said aperture in said enclosure, to a depth sufficient to encapsulate at least a portion of at least some of said solid-state chips lying within said aperture, to thereby define an encapsulated chip set;

making interconnections to at least some of said electrical connections of at least one solid-state chip of said encapsulated chip set from said second surface of said insulating substrate to thereby define an encapsulated, connected chip set; and physically separating said encapsulated, connected chip set from other sets of solid-state chips on said front surface of said insulating substrate.

2. A method according to claim 1, wherein said step of selecting a plurality of sets of solid-state chips includes the step of procuring at least one active chip.

3. A method according to claim 1, wherein said step of procuring a planar flexible insulating substrate defining a front surface and a rear surface comprises the step of tensioning said flexible insulating substrate.

4. A method according to claim 1, wherein said step of applying said first broad surface of said enclosure to said front surface of said insulating substrate with said aperture surrounding said one set of said chips precedes said step of disposing said plurality of sets of solid-state chips on said front surface of said insulating substrate.

5. A method according to claim 1, wherein said step of making interconnections includes the steps of forming apertures through said insulating substrate to at least some of said electrical connections to thereby expose at least portions of said electrical connections, and metallizing said apertures and the exposed portions of said electrical connections.

6. A method according to claim 1, wherein said step of applying said enclosure includes the step of laminating said enclosure to said front surface of said insulating substrate.

7. A method according to claim 1, wherein said step of applying said first broad surface of said enclosure includes the steps of:

applying adhesive to at least a portion of one of (a) said first broad surface of said enclosure and (b) said first broad surface of said insulating substrate; and applying said first broad surface of said enclosure to said first surface of said insulating substrate, with at least a portion of said adhesive lying therebetween.

8. A method according to claim 1, wherein:

said aperture, of said enclosure defining first and second broad surfaces and at least one aperture extending from said first broad surface to said second broad surface, defines aperture walls; and said step of applying said first broad surface of said enclosure includes the step of applying adhesive to at least a portion of said aperture walls.

9. A method according to claim 1, wherein said step of procuring a generally planar electrically conductive enclosure defining first and second broad surfaces and at least one aperture extending from said first broad surface to said second broad surface includes the step of procuring a molded generally planar electrically conductive enclosure defining first and second broad surfaces and at least one aperture extending from said first broad surface to said second broad surface.

10. A method according to claim 9, wherein said step of procuring a molded generally planar electrically conductive enclosure includes the step of procuring a molded generally planar electrically conductive carbonaceous enclosure.

11. A method according to claim 9, wherein said step of procuring a molded generally planar electrically conductive enclosure includes the step of procuring a molded generally planar electrically conductive graphite enclosure.

12. A method according to claim 1, wherein said step of procuring a generally planar electrically conductive enclosure defining first and second broad surfaces and at least one aperture extending from said first broad surface to said second broad surface includes the step of:

procuring a generally planar electrically conductive enclosure defining first and second broad surfaces, at least one aperture extending from said first broad surface to said second broad surface, and at least one additional aperture extending from said first broad surface to said second broad surface.

13. A method according to claim 1, wherein said step of procuring a generally planar electrically conductive enclosure defining first and second broad surfaces and at least one aperture extending from said first broad surface to said second broad surface includes the step of:

procuring a generally planar electrically conductive molded enclosure defining first and second broad surfaces and at least one aperture extending from said first broad surface to said second broad surface, and also including a layer of metallization extending over at least a portion of the surface thereof.

14. A method according to claim 9, further comprising the step of making electrical connection though said insulating substrate to said electrically conductive molded enclosure.

* * * * *